United States Patent
Nickel

(10) Patent No.: US 6,928,042 B2
(45) Date of Patent: Aug. 9, 2005

(54) DATA STORAGE DEVICE INCLUDING NANOTUBE ELECTRON SOURCES

(75) Inventor: Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 558 days.

(21) Appl. No.: 09/900,662

(22) Filed: Jul. 6, 2001

(65) Prior Publication Data

US 2003/0007443 A1 Jan. 9, 2003

(51) Int. Cl.$^7$ ................................................ G11B 7/00
(52) U.S. Cl. ...................................... 369/101; 369/121
(58) Field of Search ................................ 369/101, 121, 369/126, 124.02, 124.03; 250/306, 307

(56) References Cited

U.S. PATENT DOCUMENTS

| | | | |
|---|---|---|---|
| 5,557,596 A | | 9/1996 | Gibson et al. |
| 5,637,370 A | * | 6/1997 | Danz et al. ................ 428/64.1 |
| 5,986,381 A | | 11/1999 | Hoen et al. |
| 6,097,138 A | | 8/2000 | Nakamoto |
| 6,472,802 B1 | * | 10/2002 | Choi et al. .................. 313/309 |
| 6,498,349 B1 | * | 12/2002 | Thomas et al. ............. 250/398 |
| 6,542,400 B2 | * | 4/2003 | Chen et al. ................. 365/151 |
| 6,818,891 B1 | * | 11/2004 | Hough et al. ............... 250/306 |

FOREIGN PATENT DOCUMENTS

| | | |
|---|---|---|
| EP | 0 945 844 | 9/1999 |
| EP | 0 951 047 | 10/1999 |

OTHER PUBLICATIONS

Murakami H. et al: "Field Emission from Well-aligned, Patterend, Carbon nanotube Emitters" Applied Physics Letters, American Institute of Physics. New York, US, vol. 76, No. 13.

Rueckes T et al: Carbon Nanotube-based Nonvolatile Random Access Memory for Molecular Computing: Science, America Assoc. for the Advancement of Science, US vol. 289 No. 5476.

Nilsson et al. "Scanning field emission from patterned carbon nanotube films" Applied Physics Letters, vol. 76, No. 15 (Apr., 2000).

Wang et al. "Flat panel display prototype using gated carbon nanotube field emitters" Applied Physics Letters, vol. 78, No. 9 (Jan., 2001).

Hisao et al. "Self-orientation of short single-walled carbon nanotubes deposited on graphite" Applied Physics Letters, vol. 78, No. 10 (Mar., 2001).

Choi et al. "Electrophoresis deposition of carbon nanotubes for triode-type field emission display" Applied Physics Letters, vol. 78, No. 11 (Mar., 2001).

Chen et al. "Hydrogen storage in aligned carbon nanotubes" Applied Physics Letters, vol. 78, No. 15 (Apr., 2001).

Avigal et al. "Growth of aligned carbon nanotubes by biasing during growth" Applied Physics Letters, vol. 78, No. 16 (Apr., 2001).

Wang et al. "Electron field emission from carbon nanoparticles prepared by microwave-plasma chemical-vapor deposition" Applied Physics Letters, vol. 78, No. 15 (Apr., 2000).

Collazo et al. "Two field-emission states of single-walled carbon nanotubes" Applied Physics Letters, vol. 78, No. 14 (Apr., 2001).

Sugie et al. "Carbon nanotubes as electron source in an x-ray tube" Applied Physics Letters, vol. 78, No. 17 (Apr., 2001).

Jeong et al. "Template-based carbon nanotubes and their application to a field emitter" Applied Physics Letters, vol. 78, No. 14 (Apr., 2001).

Wu et al. "Fabrication of arrays of two-dimensional micropatterns using microspheres as lenses for projection photolithography" Applied Physics Letters, vol. 78, No. 16 (Apr., 2001).

* cited by examiner

*Primary Examiner*—Paul W. Huber

(57) ABSTRACT

A data storage device includes a phase-change storage layer and an array of nanotubes as electron sources.

9 Claims, 1 Drawing Sheet

DATA STORAGE DEVICE INCLUDING NANOTUBE ELECTRON SOURCES

BACKGROUND

The present invention relates generally to electron sources. The present invention also relates to data storage devices.

For decades researchers have been working to increase storage density and reduce storage cost of data storage devices such as magnetic hard-drives, optical drives, and semiconductor random access memory. However, increasing the storage density is becoming increasingly difficult because conventional technologies appear to be approaching fundamental limits on storage density. For instance, information storage based on conventional magnetic recording is rapidly approaching fundamental physical limits such as the superparamagnetic limit, below which magnetic bits are not stable at room temperature.

Storage devices that do not face these fundamental limits are being researched. An example of such an information storage device is described in Gibson et al. U.S. Pat. No. 5,557,596. The device includes multiple electron sources having electron emission surfaces that are proximate a storage medium. During write operations, the electron sources bombard the storage medium with relatively high intensity electron beams. During read operations, the electron sources bombard the storage medium with relatively low intensity electron beams.

Size of storage bits in such a device may be reduced by decreasing the electron beam diameter. Reducing the storage bit size increases storage density and capacity, and it decreases storage cost.

"Spindt" emitters could be used for generating focused electron beams in such a device. A Spindt emitter has a conical shape and emits an electron beam at the tip of its cone. The cone tip is made as sharp as possible to reduce operating voltage and achieve a small electron beam diameter.

However, certain problems arise with Spindt emitters. One problem is that the Spindt emitters are sensitive to impact. The tips of the Spindt emitters are only a few nanometers from the storage medium. If a tip makes contact with the storage medium, it could be damaged. Another problem is directionality of the electron beams emitted from the Spindt emitters. Sometimes an electron beam can come off the side of the cone rather than the tip. Yet another problem is a loss of material from the tips due to energy being greater than the workfunction. The loss of material reduces the effectiveness of the tips.

SUMMARY

According to one aspect of the present invention, a data storage device includes nanotubes as electron sources. Other aspects and advantages of the present invention will become apparent from the following detailed description, taken in conjunction with the accompanying drawings, illustrating by way of example the principles of the present invention.

DETAILED DESCRPTION

Figure 2:
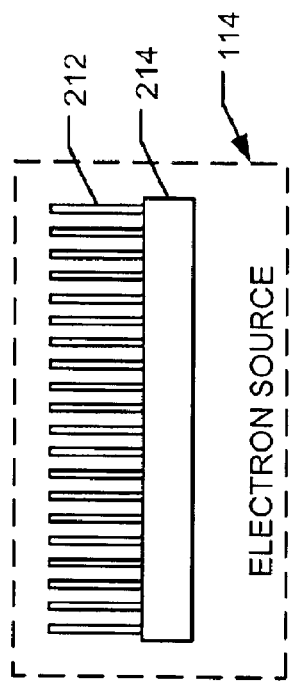
FIGS. 2 and 3 are illustrations of an array of nanotubes for the storage device.

As shown in the drawings for purposes of illustration, the present invention is embodied in an ultra-high density data storage device. The data storage device includes a storage medium and an array of nanotubes that function as electron sources. More rugged than Spindt emitters, the nanotubes are not damaged if they make contact with the storage medium. In addition, the nanotubes have a higher electron beam directionality than Spindt emitters. The higher directionality results in an electron beam having increased focus and accuracy, which allows bit size to be reduced. Reducing the bit size increases storage density and reduces storage cost. The higher directionality also allows the tips of the nanotubes to be spaced further from the storage medium. The nanotubes also have a lower material transfer rate than Spindt emitters The lower transfer rate increases the effective life of the electron sources.

Figure 1:
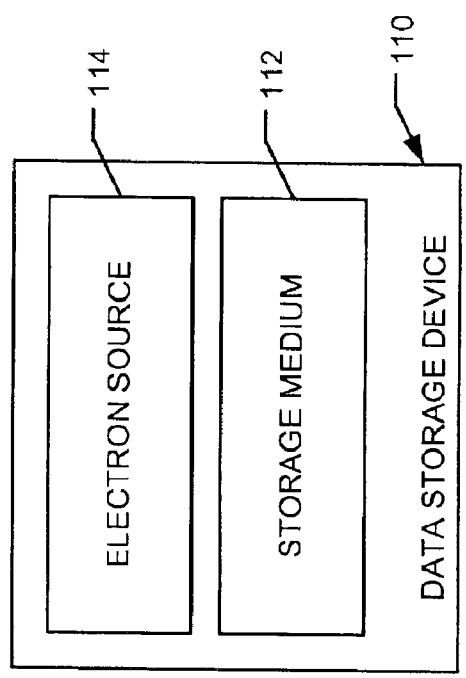
FIG. 1 is an illustration of a data storage device.

Referring to FIG. 1, the storage medium 112 of the data storage device 110 includes a storage layer. The storage layer may be made of a phase-change material such as a chalcogenide-based phase change material. Local areas of the storage layer can be reversibly changed between at least two states by application of focused radiation with appropriate time dependence of power amplitude. For instance, local areas may be changed between amorphous and crystalline states, or they may be changed between different crystalline states. The state of an area may be changed from crystalline to amorphous by heating the area with a high intensity energy beam, enough to melt the phase change material, and then quickly decreasing the intensity of the beam to quench the area. Quenching a phase-change material causes it to cool rapidly into an amorphous state without time to nucleate and grow crystalline grains. The state of an area may be changed from amorphous to crystalline by using an energy beam to heat the phase-change material at a temperature sufficient to allow nucleation and growth of crystalline grains. The different states represent different logic values.

The storage device 110 also includes an array 114 of nanotubes (e.g., carbon nanotubes, boron nitride nanotubes) that function as electron sources. Each nanotube emits an electron beam having appropriate time dependence of power amplitude to change a local storage area between amorphous and crystalline states or between different crystalline states. Tips of the nanotubes are proximate the storage layer. Electron optics may be used to focus the electron beams onto the storage medium 112.

The array 114 of nanotube electron sources may be stationary relative to the storage medium 112. Thus, each nanotube tip may be stationed over a local storage area. In the alternative, micromovers (not shown) may be used to scan the array 114 of nanotubes along the surface of the storage layer during read and write operations. Exemplary micromovers are described in assignee's U.S. Pat. No. 5,986,381.

Ruggedness and high directionality of the nanotubes allows a relaxation of the tolerances of the distance between the nanotube tips and the phase-change layer surface, the flatness of the phase-change layer surface, etc.

Reference is now made to FIG. 2, which shows the array 114 of nanotubes 212. The nanotubes 212 may be single-walled or double-walled, and they are defined by their diameter, length, conductivity, and chirality or twist. The nanotubes 212 are preferably elongated, as a higher aspect ratio provides better directionality. The nanotubes 212 may have an aspect ratio greater than 10:1. Carbon nanotubes, for example, are fullerene-related structures that are long, thin tubes of carbon. The carbon nanotubes are tightly bonded, which results in a low material transfer rate with the phase-change layer of the storage medium 112.

The nanotubes 212 are formed on a substrate 214. Photolithographic or other masking techniques may be used to define where on the substrate 214 the nanotubes 212 are grown. Although only a single column of ten nanotubes 212 is shown in FIG. 2, the array 114 may have any number of rows and columns. The array 114 may include hundreds or thousands of the nanotubes 212. Spacing between the nanotubes 212 will depend in part upon whether a micromover is used to scan the array 114 across the surface of the storage layer.

A non-photolithographic technique of fabricating carbon nanotubes 114 on a silicon substrate is described in Nilsson et al., "Scanning field emission from patterned carbon nanotube films," Applied Physics Letters, Vol. 76, No. 15, April, 2000. Catalytic inks are "printed" as a pattern on the native oxide of the silicon substrate, and carbon nanotubes are grown.

Figure 3:
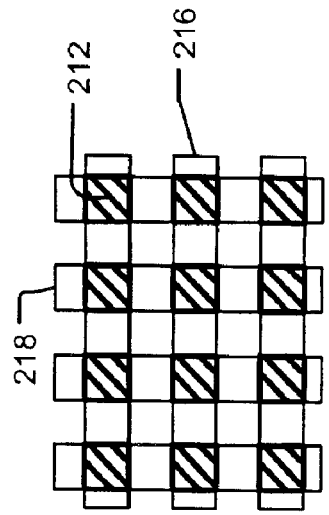

Referring additionally to FIG. 3, word and bit lines 216 and 218 for addressing the nanotubes 212 are also formed on the substrate 214. The nanotubes 212 may be addressed simultaneously or in a multiplexed manner during read and write operations. To select a nanotube to generate an electron beam during a read or write operation, a voltage is created between the selected nanotube 212 and the storage medium 112. The word and bit lines 216 and 218 are used to apply a voltage to the selected nanotube 212. A reference potential is applied to the storage medium 112, such that the selected nanotube 212 becomes a cathode and the storage medium 112 becomes an anode. The conductivity of the nanotubes 212 can be changed and the potentials can be varied to obtain electron beams of a desired time dependence of amplitude. The nanotubes 212 do not need an ultra-high vacuum to generate the electron beams.

Read and write operations may be performed as described in Gibson et al. U.S. Pat. No. 5,557,596, except that nanotubes are used instead of Spindt emitters.

The nanotube electron sources are not limited to use in data storage devices. For instance, the nanotube electron sources may be used as electron emitters in lithographic applications.

Although a specific embodiment of the present invention has been described and illustrated, the present invention is not limited to the specific forms or arrangements of parts so described and illustrated. Instead, the present invention is construed according to the claims that follow.

What is claimed is:

1. A data storage device comprising an array of nanotubes as electron sources; and a phase-change storage layer proximate tips of the electron sources.

2. The device of claim 1, wherein the nanotubes are carbon-based.

3. The device of claim 1, wherein the nanotubes are boron nitride-based.

4. The device of claim 1, wherein each nanotube electron source is elongated.

5. The device of claim 4, wherein the nanotubes have an aspect ratio greater than 10:1.

6. The device of claim 1, further comprising word and bit lines for addressing the nanotubes.

7. The device of claim 1, further comprising a micromover for positioning the array.

8. A data storage device comprising:

an array of carbon-based nanotubes; and a phase-change storage layer proximate tips of the nanotubes.

9. A data storage device comprising:

an array of boron nitride-based nanotubes; and a phase-change storage layer proximate tips of the nanotubes.

* * * * *